United States Patent
Kim et al.

(10) Patent No.: US 11,476,833 B2
(45) Date of Patent: Oct. 18, 2022

(54) ACOUSTIC RESONATOR

(71) Applicant: SAMSUNG ELECTRO-MECHANICS CO., LTD., Suwon-si (KR)

(72) Inventors: Tae Yoon Kim, Suwon-si (KR); Tae Kyung Lee, Suwon-si (KR); Sang Kee Yoon, Suwon-si (KR); Sung Jun Lee, Suwon-si (KR); Chang Hyun Lim, Suwon-si (KR); Nam Jung Lee, Suwon-si (KR); Tae Hun Lee, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 769 days.

(21) Appl. No.: 16/435,621

(22) Filed: Jun. 10, 2019

(65) Prior Publication Data

US 2020/0169246 A1    May 28, 2020

(30) Foreign Application Priority Data

Nov. 22, 2018 (KR) .................. 10-2018-0145454

(51) Int. Cl.
    *H03H 9/17*      (2006.01)
    *H03H 9/02*      (2006.01)
    *H03H 9/13*      (2006.01)

(52) U.S. Cl.
    CPC ........ *H03H 9/178* (2013.01); *H03H 9/02118* (2013.01); *H03H 9/132* (2013.01); *H03H 9/174* (2013.01)

(58) Field of Classification Search
    CPC .... H03H 9/178; H03H 9/02118; H03H 9/132; H03H 9/174
    See application file for complete search history.

(56) References Cited

U.S. PATENT DOCUMENTS

| 8,134,278 B2 | 3/2012 | Cho et al. |
| 2003/0231851 A1 | 12/2003 | Rantala et al. |
| 2007/0194863 A1* | 8/2007 | Shibata ............ H03H 3/02 333/187 |
| 2011/0304412 A1 | 12/2011 | Zhang |
| 2016/0035960 A1* | 2/2016 | Lee ............ H03H 9/173 216/13 |
| 2017/0077898 A1* | 3/2017 | Park ............ H03H 9/173 |
| 2018/0351533 A1* | 12/2018 | Lee ............ H03H 9/174 |
| 2018/0351534 A1* | 12/2018 | Lee ............ H03H 9/131 |

FOREIGN PATENT DOCUMENTS

| CN | 107241077 A | 10/2017 |
| CN | 207603582 U | 7/2018 |
| KR | 10-1644165 B1 | 7/2016 |

* cited by examiner

*Primary Examiner* — Bryan P Gordon
(74) *Attorney, Agent, or Firm* — NSIP Law

(57) ABSTRACT

An acoustic resonator includes a substrate, an insulation layer disposed on the substrate, a resonating portion disposed on the insulation layer and having a first electrode, a piezoelectric layer, and a second electrode, stacked thereon, a cavity disposed between the insulation layer and the resonating portion, a protruded portion having a plurality of protrusions disposed on a lower surface of the cavity, and a hydrophobic layer disposed on an upper surface of the cavity and a surface of the protruded portion.

20 Claims, 12 Drawing Sheets

ACOUSTIC RESONATOR

CROSS-REFERENCE TO RELATED APPLICATION

This application claims the benefit under 35 35 U.S.C. 119(a) of Korean Patent Application No. 10-2018-0145454 filed on Nov. 22, 2018, in the Korean Intellectual Property Office, the entire disclosure of which is incorporated herein by reference for all purposes.

BACKGROUND

1. Field

This application relates to an acoustic resonator.

2. Description of the Background

Recent rapid development of mobile communications devices, chemistry-related devices, bio-related devices, and the like, have increased demand for compact and lightweight filters, oscillators, resonant elements, acoustic resonant mass sensors, and the like, used in such devices.

A thin-film bulk acoustic resonator (FBAR) may be utilized as a means for implementing such compact and lightweight filters, oscillators, resonant elements, or acoustic resonant mass sensors.

An FBAR may be advantageous for mass-production at relatively low cost, and for being implemented in a very small size. In addition, there are advantages that it is possible to implement a high quality factor (Q) value, which may be a major characteristic of a filter, and may be used in a microwave frequency band, and in particular, even in a personal communications system (PCS) band and a digital cordless system (DCS) band.

Generally, an FBAR has a structure including a resonating portion formed by sequentially stacking a first electrode, a piezoelectric body, and a second electrode on a substrate.

The principle of operation of an FBAR is as follows. First, when electrical energy is applied to the first and second electrodes to induce an electric field in the piezoelectric layer, this electric field induces a piezoelectric phenomenon in the piezoelectric layer such that the resonating portion vibrates in a predetermined direction. As a result, an acoustic wave may be generated in the same direction as the vibration direction, to generate resonance.

The FBAR may be a device using a bulk acoustic wave (BAW), and the effective electromechanical coupling coefficient (Kt2) of the piezoelectric body therein may be increased. Therefore, the frequency characteristics of the acoustic wave device may be improved, and it is possible to broaden the bands.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes a substrate, an insulation layer disposed on the substrate, a resonating portion disposed on the insulation layer and having a first electrode, a piezoelectric layer, and a second electrode, stacked thereon, a cavity disposed between the insulation layer and the resonating portion, a protruded portion having a plurality of protrusions disposed on a lower surface of the cavity, and a hydrophobic layer disposed on an upper surface of the cavity and a surface of the protruded portion.

The protruded portion may be disposed in a central region of the lower surface of the cavity.

The protruded portion may have a shape corresponding to the lower surface of the cavity.

An area occupied by the protruded portion on the lower surface of the cavity may be about 40% or more by area, and an interval between the plurality of protrusions is about 2 μm to about 20 μm.

A width of the protrusion may be 5 μm or less.

A height of the protrusion may be 10 to 90% of a thickness of the cavity.

The protrusion may have one or more of a cylindrical shape, a polygonal column shape, a truncated conical shape, or a truncated polygonal pyramid shape.

The protrusion may have a wet etch formed cylindrical shape.

The protrusion may have a dry etch formed truncated conical shape.

The resonating portion may have a thickness of less than 1 μm.

A further hydrophobic layer may be disposed on a portion of the lower surface of the cavity, except for the protruded portion, and on a side surface of the cavity.

The hydrophobic layer may be a monolayer or a self-assembled monolayer (SAM).

The hydrophobic layer may include a fluorine (F) component.

The hydrophobic layer may further include a silicon (Si) component.

The resonating portion may include a central region and an extension region in which an insertion layer is disposed below the piezoelectric layer, the extension region extending from the central region in an outward direction, and the piezoelectric layer may include a piezoelectric portion disposed in the central region and a bent portion disposed in the extension region and extending obliquely in the piezoelectric portion along a shape of the insertion layer.

In another general aspect, an acoustic resonator includes a substrate, an insulation layer disposed on the substrate, a resonating portion disposed on the insulation layer and having a first electrode, a piezoelectric layer, and a second electrode, stacked thereon, a cavity disposed between the insulation layer and the resonating portion, and a protruded portion having a plurality of protrusions disposed on a lower surface of the cavity, wherein an area occupied by the protruded portion on the lower surface of the cavity is about 40% or more by area, and wherein an interval between the plurality of protrusions is about 2 μm to about 20 μm.

In another general aspect, a resonator includes a cavity disposed on a substrate, a resonating portion disposed on the cavity, and a protruded portion having a plurality of protrusions disposed on a lower surface of the cavity and spaced apart from the resonating portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
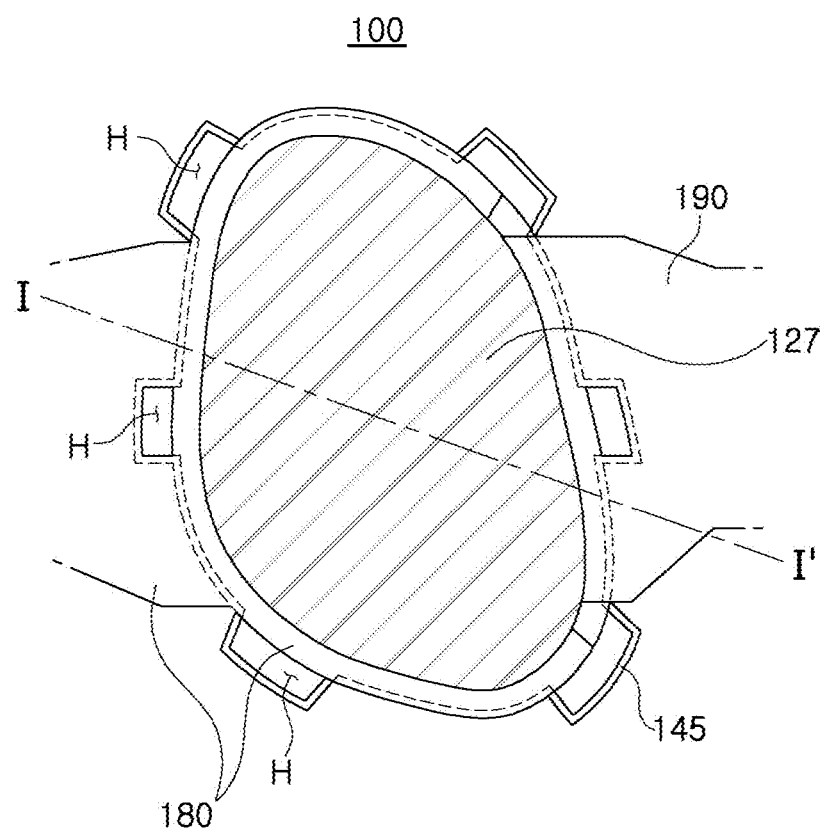
FIG. 1 is a plan view of an acoustic resonator according to one or more examples described herein.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example, for example, as to what an example may include or implement, means that at least one example exists in which such a feature is included or implemented while all examples are not limited thereto.

An aspect of the present disclosure is directed to solving a problem in which upper and lower surfaces of a cavity may be adhered to each other in a wet process, which may be included during a manufacturing method of an acoustic resonator.

Acoustic Resonator

Figure 2:
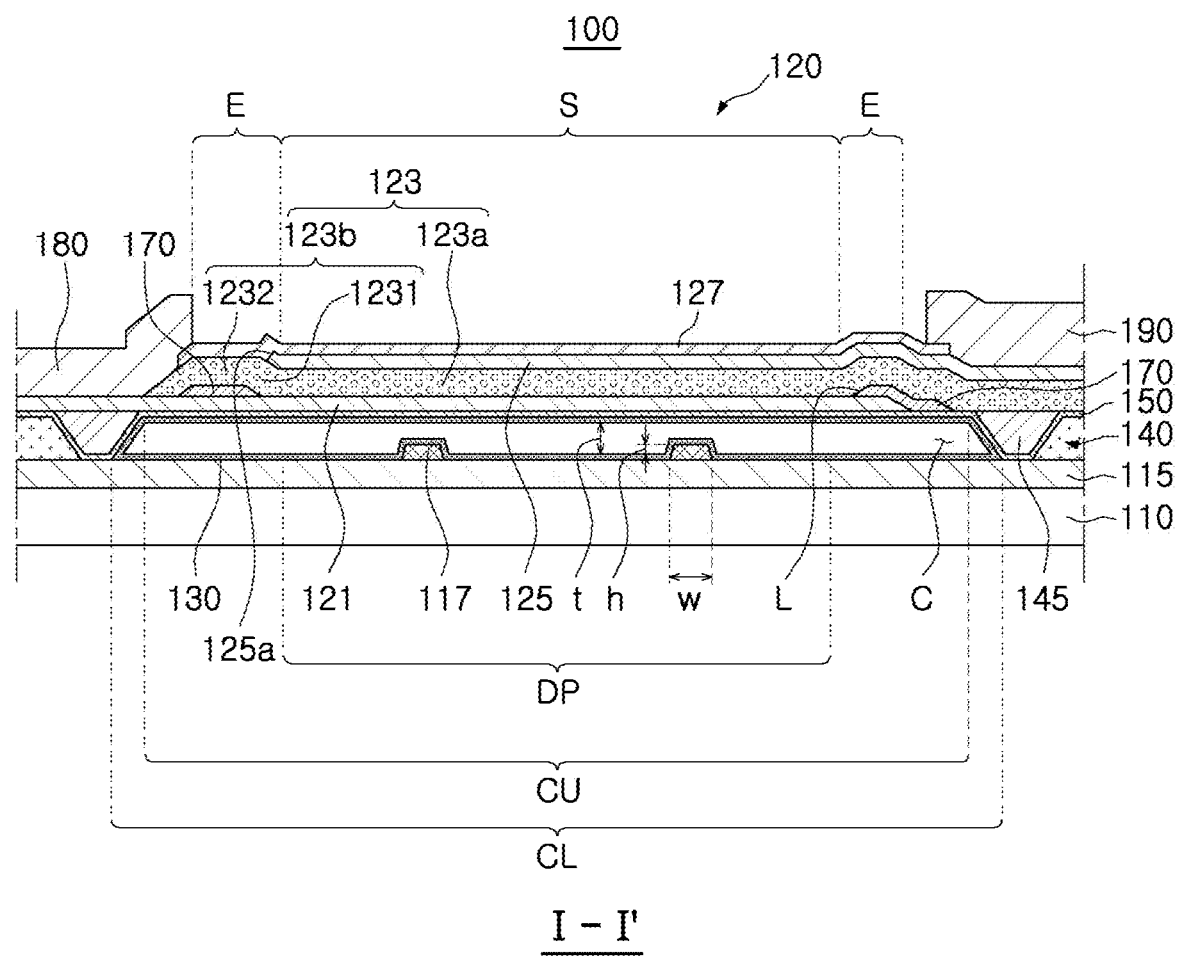
FIG. 2 is a cross-sectional view taken along line I-I' of FIG. 1.
Figure 3:
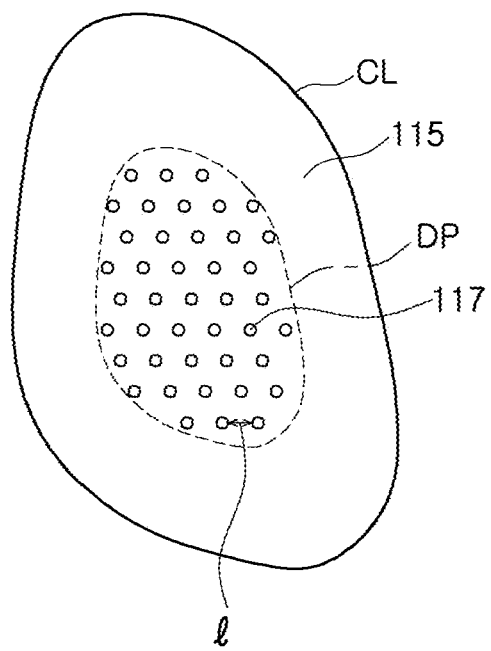
FIG. 3 is a view illustrating a lower surface of a cavity of an acoustic resonator according to one or more examples described herein.

FIG. 1 is a plan view of an acoustic resonator according to one or more examples described herein. FIG. 2 is a cross-sectional view taken along line I-I' of FIG. 1. FIG. 3 is a view illustrating a lower surface of a cavity of an acoustic resonator according to one or more examples described herein.

Referring to FIGS. 1 to 3, an acoustic resonator 100 according to the examples described herein may be a thin-film bulk acoustic resonator (FBAR), and may include a substrate 110, an insulation layer 115, a membrane layer 150, a cavity C, a protrusion 117, a hydrophobic layer 130, and a resonating portion 120.

The substrate 110 may be a silicon substrate. For example, as the substrate 110, a silicon wafer may be used, or a silicon on insulator (SOI) type substrate may be used.

The insulation layer 115 may be provided on an upper surface of the substrate 110 to electrically isolate the substrate 110 from the resonating portion 120. Further, the insulation layer 115 may prevent the substrate 110 from being etched by the etching gas, when the cavity C is formed in a process of manufacturing the acoustic resonator.

In this case, the insulation layer 115 may be formed of at least one of silicon dioxide ($SiO_2$), silicon nitride ($Si_3N_4$), aluminum oxide ($Al_2O_2$), and aluminum nitride (AlN), and may be formed on the substrate 110 through any one of a thermal oxidation process, a chemical vapor deposition process, an RF magnetron sputtering process, and an evaporation process.

A sacrificial layer 140 may be formed on the insulation layer 115, and the cavity C and an etching stop portion 145 may be disposed in the sacrificial layer 140.

The cavity C may be formed as a void, and may be formed by removing a portion of the sacrificial layer 140.

As the cavity C is formed in the sacrificial layer 140, the resonating portion 120 formed on an upper surface of the sacrificial layer 140 may be formed to be planar as a whole.

The etching stop portion 145 may be disposed along a boundary of the cavity C. The etching stop portion 145 may be provided to prevent the etching process from proceeding beyond an area of the cavity in a process of forming the cavity C. Therefore, an area of the cavity C in a horizontal direction may be defined by the etching stop portion 145, and an area of the cavity C in a vertical direction may be defined by a thickness of the sacrificial layer 140.

The membrane layer 150 may be formed on the sacrificial layer 140 to define a thickness (or a depth) of the cavity C, together with the insulation layer 115. However, a structure of the present disclosure is not limited thereto, and in an example the membrane layer 150 may be omitted therefrom.

The membrane layer 150 may be formed of a material that may not be easily removed in the process of forming the cavity C. For example, when a halide-based etching gas such as fluorine (F) or chlorine (Cl) is used to remove a portion of the sacrificial layer 140 (for example, an area of the cavity), the membrane layer 150 may be formed of a material having a relative low reactivity with the etching gas. In this case, the membrane layer 150 may include at least one of silicon dioxide ($SiO_2$) and silicon nitride ($Si_3N_4$).

In addition, the membrane layer 150 may include a dielectric layer containing at least one material among manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer containing at least one material among aluminum (Al), nickel (Ni), chromium (Cr), platinum (Pt), gallium (Ga), and hafnium (Hf). However, the examples described herein are not limited thereto.

A seed layer (not illustrated) made of aluminum nitride (AlN) may be formed on the membrane layer 150. For example, the seed layer may be disposed between the membrane layer 150 and a first electrode 121. In addition to aluminum nitride (AlN), the seed layer may further include a rare earth metal, a transition metal, or an alkaline earth metal in the case of doped aluminum nitride, and may be made of a dielectric material or metal having an HCP structure. In the case of a metal, for example, the seed layer may be formed of titanium (Ti).

In a case of a structure without the membrane layer 150, the seed layer may be formed on the sacrificial layer 140 to define a thickness (or a depth) of the cavity C, together with the insulation layer 115.

The resonating portion 120 may include the first electrode 121, a piezoelectric layer 123, and a second electrode 125. The first electrode 121, the piezoelectric layer 123, and the second electrode 125 may be stacked in sequence, from a bottom surface of the resonating portion 120. Therefore, the piezoelectric layer 123 in the resonating portion 120 may be disposed between the first electrode 121 and the second electrode 125.

When the resonating portion 120 is formed on the membrane layer 150, the membrane layer 150, the first electrode 121, the piezoelectric layer 123, and the second electrode 125 may be stacked in sequence to form the resonating portion 120.

In a case of a structure without the membrane layer 150, the resonating portion 120 may be formed on the seed layer, and the seed layer, the first electrode 121, the piezoelectric layer 123, and the second electrode 125 may be stacked in sequence to form a resonating portion 120.

The resonating portion 120 may resonate the piezoelectric layer 123, according to a signal applied to the first electrode 121 and the second electrode 125, to generate a resonance frequency and an anti-resonance frequency.

When an insertion layer 170 to be described later is formed, the resonating portion 120 may be divided into a central region S in which the first electrode 121, the piezoelectric layer 123, and the second electrode 125 are stacked to be approximately planar, and an extension region E in which the insertion layer 170 is interposed between the first electrode 121 and the piezoelectric layer 123.

The central region S may be an area disposed in a central portion of the resonating portion 120, and the extension region E may be an area disposed along a periphery of the central region S. Therefore, the extension region E refers to an area extending from the central region S in an outward direction.

The insertion layer 170 may include an inclined surface L of which thickness increases, as a distance from the central region S increases.

The piezoelectric layer 123 and the second electrode 125 in the extension region E may be disposed on the insertion layer 170. Therefore, the piezoelectric layer 123 and the second electrode 125 located in the extension region E may include inclined surfaces along a shape of the insertion layer 170.

In the examples described herein, the extension region E may be defined as being included in the resonating portion 120. Therefore, resonance may also occur in the extension region E. However, the examples described herein are not limited thereto. Depending on a structure of the extension region E, resonance may not occur in the extension region E, but resonance may occur only in the central region S.

The first electrode 121 and the second electrode 125 may be formed of a conductive material, for example, gold, molybdenum, ruthenium, iridium, aluminum, platinum, titanium, tungsten, palladium, tantalum, chromium, nickel, or a metal comprising at least one thereof, and may include at least one of rare earth metals and transition metals, but are not limited thereto.

The first electrode 121 may be formed to have a larger area than the second electrode 125 in the resonating portion 120, and a first metal layer 180 may be formed on the first electrode 121 along the outer periphery of the first electrode 121. Therefore, the first metal layer 180 may be disposed to surround the second electrode 125.

Since the first electrode 121 may be disposed on the membrane layer 150, the first electrode 121 may be formed to be planar as a whole. Since the second electrode 125 may be disposed on the piezoelectric layer 123, the second electrode 125 may be bent corresponding to a shape of the piezoelectric layer 123.

The second electrode 125 may be entirely disposed in the central region S, and partially disposed in the extension region E. The second electrode 125 may be divided into a portion disposed on a piezoelectric portion 123a of the piezoelectric layer 123, and a portion disposed on a bent portion 123b of the piezoelectric layer 123, which will be described later.

For example, in an embodiment of the present disclosure, the second electrode 125 may be disposed to cover the piezoelectric portion 123a as a whole and a portion of an inclined portion 1231 of the piezoelectric layer 123. Therefore, the second electrode 125a disposed in the extension region E may be formed to have an area smaller than an inclined surface of the inclined portion 1231, and the second electrode 125 in the resonating portion 120 may be formed to have an area smaller than the piezoelectric layer 123.

The piezoelectric layer 123 may be formed on the first electrode 121. When an insertion layer 170 to be described later is formed, the piezoelectric layer 123 may be formed on the first electrode 121 and the insertion layer 170.

As the material of the piezoelectric layer 123, zinc oxide (ZnO), aluminum nitride (AlN), doped aluminum nitride, lead zirconate titanate, quartz, or the like, may be selectively used. In the case of the doped aluminum nitride, a rare earth metal, a transition metal, or an alkaline earth metal may further be included. For example, the rare earth metal may include at least one of scandium (Sc), erbium (Er), yttrium (Y), and lanthanum (La), and amounts of the rare earth metal may be about 1 at % (atomic percent) to about 20 at %. The transition metal may include at least one of hafnium (Hf), titanium (Ti), zirconium (Zr), tantalum (Ta), and niobium (Nb). The alkaline earth metal may include magnesium (Mg).

The piezoelectric layer 123 in the examples described herein may include a piezoelectric portion 123a disposed in the central region S, and a bent portion 123b disposed in the extension region E.

The piezoelectric portion 123a may be a portion directly stacked on an upper surface of the first electrode 121. Therefore, the piezoelectric portion 123a may be interposed between the first electrode 121 and the second electrode 125, to form a planar shape, together with the first electrode 121 and the second electrode 125.

The bent portion 123b may be defined as an area extending from the piezoelectric portion 123a in an outward direction and located in the extension region E.

The bent portion 123b may be disposed on the insertion layer 170, which will be described later, and may be formed to have a shape rising along a shape of the insertion layer 170. The piezoelectric layer 123 may be bent at a boundary between the piezoelectric portion 123a and the bent portion 123b, and the bent portion 123b may be raised corresponding to a thickness and shape of the insertion layer 170.

The bent portion 123b may be divided into an inclined portion 1231 and an extended portion 1232.

The inclined portion 1231 refers to a portion formed to be inclined along an inclined surface L of the insertion layer 170, which will be described later. The extended portion 1232 refers to a portion extending from the inclined portion 1231 in an outward direction.

The inclined portion 1231 may be formed parallel to the inclined surface L of the insertion layer 170, and an inclination angle of the inclined portion 1231 may be equal to an inclination angle of the inclined surface L of the insertion layer 170.

The insertion layer 170 may be disposed along a surface formed by the membrane layer 150, the first electrode 121, and the etching stop portion 145.

The insertion layer 170 may be disposed around the central region S to support the bent portion 123b of the piezoelectric layer 123. The bent portion 123b of the piezoelectric layer 123 may be divided into the inclined portion 1231 and the extended portion 1232, along a shape of the insertion layer 170.

The insertion layer 170 may be disposed in an area except for the central region S. For example, the insertion layer 170 may be entirely disposed in an area except for the central region S, or may be partially disposed in the area.

At least a portion of the insertion layer 170 may be disposed between the piezoelectric layer 123 and the first electrode 121.

A side surface of the insertion layer 170 disposed along a boundary of the central region S may be formed in a thicker form, as a distance from the central region S increases. The insertion layer 170 may be formed of an inclined surface L having a predetermined inclination angle which is disposed adjacent to the central region S.

When the inclination angle of the side surface of the insertion layer 170 is less than 5°, a thickness of the insertion layer 170 should be very thin or an area of the inclined surface L should be excessively large to manufacture the insertion layer 170. Therefore, it is difficult to implement such a structure of the insertion layer 170.

When the inclination angle of the side surface of the insertion layer 170 is greater than 70°, an inclination angle of the inclined portion 1231 of the piezoelectric layer 123 stacked on the insertion layer 170 may be formed greater than 70°. In this case, since the piezoelectric layer 123 may be excessively bent, a crack may be generated in the bent portion of the piezoelectric layer 123.

Therefore, in the examples described herein, an inclination angle of the inclined surface L may be in a range of 5° or more to 70° or less.

The insertion layer 170 may be formed of a dielectric material such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from that of the piezoelectric layer 123. Also, if necessary, an area in which the insertion layer 170 is provided may be formed as an air space. For example, this may be realized by forming all of the resonating portion 120, and then removing the insertion layer 170 in the manufacturing process.

In the examples described herein, a thickness of the insertion layer 170 may be the same as or similar to a thickness of the first electrode 121.

The insertion layer 170 may be thinner than the piezoelectric layer 123. Since the inclined portion of the piezoelectric layer 123 due to the insertion layer may be formed to be thinner than the piezoelectric layer 123, cracks or the like may not be generated, to contribute to performance enhancement of the resonator. A lower limit of the thickness of the insertion layer 170 is not particularly limited, but the thickness of the insertion layer 170 may be 100 Å or more to easily adjust the deposition thickness, and ensure uniformity in the thickness of the deposited wafer.

The resonating portion 120 having such a structure according to the examples described herein may be spaced apart from the substrate 110 by the cavity C formed as a void.

The cavity C may be formed by supplying an etching gas (or an etching solution) through an injection hole (H in FIG. 1) to remove a portion of the sacrificial layer 140 in a manufacturing process of the acoustic resonator.

A protection layer 127 may be disposed along a surface of the acoustic resonator 100 to protect the acoustic resonator 100 from the outside. The protection layer 127 may be disposed along the second electrode 125, the bent portion 123b of the piezoelectric layer 123, and a surface in which the insertion layer 170 is formed.

The protection layer 127 may be formed of any one of silicon oxide-based materials, silicon nitride-based materials, aluminum oxide-based materials, and aluminum nitride-based materials.

The first electrode 121 and the second electrode 125 may extend and be formed in an outward direction of the resonating portion 120, and a first metal layer 180 and a second metal layer 190 may be disposed on an upper surface of the extended and formed portion.

The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum-germanium (Al—Ge) alloy, or the like.

The first metal layer 180 and the second metal layer 190 may function as connection wirings, or as a connection terminal for electrically connecting electrodes of other acoustic resonators disposed adjacent to the electrodes 121 and 125 of the acoustic resonator, according to the examples described herein. However, the examples described herein are not limited thereto.

Although FIG. 2 illustrates a case in which the insertion layer 170 is removed below the second metal layer 190, the examples described herein are not limited thereto, but, if necessary, a configuration in which the insertion layer 170 is disposed below the second metal layer 190 may be implemented.

The first metal layer 180 may pass through the insertion layer 170 and the protection layer 127 to contact the first electrode 121.

As illustrated in FIG. 3, the first electrode 121 may be formed to have a wider area than the second electrode 125, and the first metal layer 180 may be formed at the periphery of the first electrode 121.

Therefore, the first metal layer 180 may be disposed along the periphery of the resonating portion 120, and may be disposed to surround the second electrode 125. However, the examples described herein are not limited thereto.

As described above, the second electrode 125 according to the examples described herein may be stacked on the piezoelectric portion 123a and the inclined portion 1231 of the piezoelectric layer 123. A portion of the second electrode 125 disposed on the inclined portion 1231 of the piezoelectric layer 123 (125a in FIG. 2), for example, the second electrode 125a disposed in the extension region E, may be not disposed on the entire inclined surface of the inclined surface 1231, but on only a portion of the inclined surface.

A protruded portion DP formed with a plurality of protrusions 117 may be disposed on a lower surface CL of the cavity C, and the hydrophobic layer 130 may be disposed on an upper surface CU of the cavity C and a surface of the protruded portion DP.

In an acoustic resonator, a wet process may be required for subsequent processes such as an additional frequency trimming operation. Since surfaces of the insulation layer 115, the membrane layer 150, the etching stop portion 145, and the sacrificial layer 140, constituting an outer wall of the cavity C, may be hydrophilic, in the case of the related art, failure (stiction failure) in which the upper surface CU and the lower surface CL of the cavity are irreversibly adhered to each other may occur.

Also, the resonance frequency of the acoustic resonator may depend on the thickness of the resonating portion 120. The resonator should be formed by the resonating portion 120 which is much thinner, as the frequency is a relative ultra-high frequency such as frequency at 6 GHz or less (sub-6 GHz) band. As the thickness of the resonating portion 120 becomes thinner, the stiction failure may occur more frequently.

Figure 4:
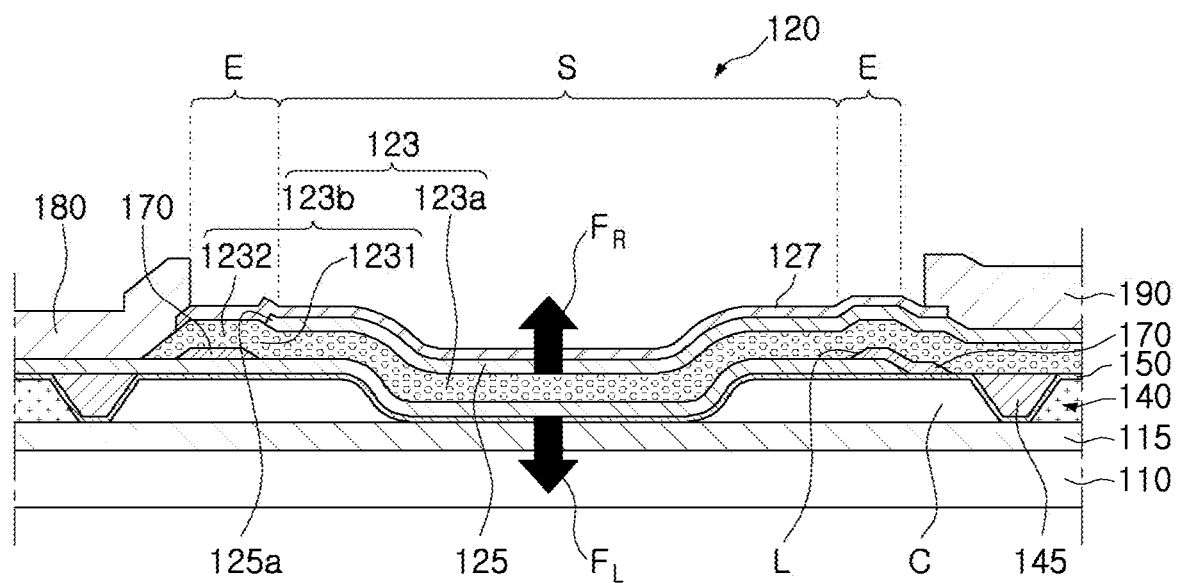
FIG. 4 is a cross-sectional view illustrating a case in which upper and lower surfaces of a cavity are adhered.

FIG. 4 is a cross-sectional view illustrating a case in which upper and lower surfaces of a cavity are irreversibly adhered.

Referring to FIG. 4, the stiction failure may occur in the case that a surface tension $F_L$ generated in a process of putting a solution into the cavity C and drying the solution during the wet process is greater than an elastic restoring force $F_R$ of the resonating portion 120.

Since the elastic restoring force $F_R$ is proportional to the cube of the thickness of the resonating portion 120, the elastic restoring force $F_R$ may sharply decrease to increase probability of the stiction failure, as the thickness of the resonating portion 120 is thinner.

The surface tension $F_L$ may increase as contact area between the upper surface CU and the lower surface CL of the cavity increases, may increase as contact angle with the solution during the wet process is narrower, and may increase as a thickness (t) of the cavity (C) is thinner.

In FIG. 4, since the surface tension $F_L$ is greater than the elastic restoring force $F_R$ of the resonating portion 120, failure (stiction failure) in which the upper surface CU and the lower surface CL of the cavity are irreversibly adhered to each other may occur.

Figure 5:
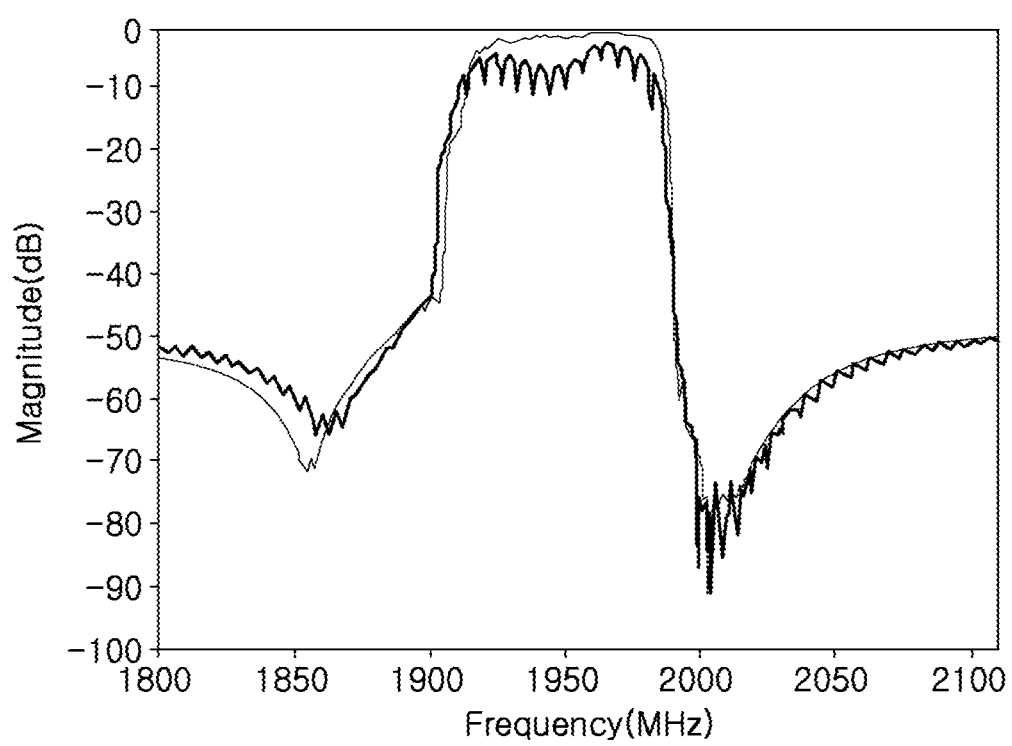
FIG. 5 is a graph illustrating a waveform (thick solid line) in a case in which adhesion of upper and lower surfaces of a cavity occurs (stiction failure), and a waveform (thin solid line) in the case in which adhesion of upper and lower surfaces of a cavity does not occur.

FIG. 5 is a graph illustrating a waveform (thick solid line) in a case in which adhesion of upper and lower surfaces of a cavity occurs (stiction failure), and a waveform (thin solid line) in the case in which adhesion of upper and lower surfaces of a cavity does not occur. When the stiction failure occurs, it may be confirmed that performance of the resonator greatly deteriorates, and a ripple effect occurs in the BAW filter waveform, as illustrated in FIG. 5.

Therefore, the present disclosure is to prevent the lower surface CL and the upper surface CU of the cavity C from being irreversibly adhered to each other, by locating the protruded portion DP having the plurality of protrusions 117 on the lower surface CL of the cavity C to minimize the contact area when the upper surface and the lower surface of the cavity C are adhered to each other, and by locating the hydrophobic layer 130 on the upper surface CU of the cavity C and the surface of the protruded portions DP to maximize the contact angle with the solution during the wet process, to minimize the surface tension $F_L$.

Referring to FIG. 3, the protruded portion DP may be disposed at the central region of the lower surface CL of the cavity. Since deformation of the resonator may be maximized in the central region, the stiction failure may be more effectively suppressed when the protruded portion DP is disposed at the central region of the lower surface CL of the cavity.

In addition, a shape of the protruded portion DP is not particularly limited, and may be a circular shape, a polygonal shape, or the like. As illustrated in FIG. 3, the stiction failure may be more effectively suppressed when the protruded portion DP has a shape corresponding to the lower surface CL of the cavity.

Experimental Example 1

Table 1 below illustrates a stiction failure rate of a 6 GHz or less (sub-6 GHz) band resonator, depending on whether a protrusion was formed or a hydrophobic layer was formed.

At this time, protrusions were formed such that an area of a protruded portion DP was 50% of an area of a lower surface CL of a cavity and an interval ($\ell$) of the protrusions was 16 μm. The hydrophobic layer was formed of fluorocarbons on an upper surface CU of the cavity and the protruded portions DP. Also, an area of the resonator was 32,400 μm², and the total thickness of a resonating portion was 0.877 μm.

Also, the stiction failure rate refers to a ratio of the number of resonators in which stiction was generated among 1,260 total number of resonators on a substrate.

TABLE 1

| Test No. | Protrusion Formation | hydrophobic layer Formation | Stiction Failure Rate |
| --- | --- | --- | --- |
| 1 | X | X | 93.8% |
| 2 | X | O | 59.3% |
| 3 | O | X | 0.95% |
| 4 | O | O | 0% |

Test No. 1, in which both protrusions and hydrophobic layers were absent, showed a very high stiction failure rate of 93.8%.

Test No. 2, in which no protrusions were formed but only hydrophobic layers were formed, showed a low stiction failure rate of 59.3%.

Test No. 3, in which no hydrophobic layers were formed but only protrusions were formed, showed a very low stiction failure rate of 0.95%.

In the case of Test No. 4 in which both protrusions and hydrophobic layers were formed, the stiction failure rate was 0%.

Even when only the protrusions were formed, a failure rate as low as about 1% may be secured, but a failure rate close to 1% in producing an actual resonator may not be mass-produced. Therefore, securing the failure rate to 0% may be very important for quality assurance, productivity improvement, and production cost reduction.

Therefore, it may be confirmed that the stiction failure may be reliably suppressed, when the protruded portions DP formed with the plurality of protrusions 117 are disposed on the lower surface CL of the cavity C, and the hydrophobic layers 130 are disposed on the upper surface CU of the cavity C and the protruded portions DP.

Experimental Example 2

An area of the protruded portion DP and an interval ($\ell$) between the protrusions were set to values illustrated in the following Table 2, without forming a hydrophobic layer, in order to check the stiction failure rate according to the area of the protruded portion DP and the interval ($\ell$) between the protrusions. Also, an area of the resonator was 32,400 μm², and the total thickness of the resonator was 1 μm.

In Table 2, the protruded portion area refers to an area occupied by the protruded portion DP on the lower surface CL of the cavity.

TABLE 2

| Test No. | Protruded Portion Area (Area %) | Protrusion Interval (μm) | Stiction Failure Rate |
| --- | --- | --- | --- |
| 5 | 20 | 8 | 49% |
| 6 | 20 | 12 | 47% |
| 7 | 20 | 16 | 74% |
| 8 | 50 | 8 | 0% |
| 9 | 50 | 12 | 0% |
| 10 | 50 | 16 | 0% |
| 11 | 50 | 32 | 4% |
| 12 | 80 | 8 | 0% |
| 13 | 80 | 12 | 0% |
| 14 | 80 | 16 | 0% |

In the case of Test Nos. 5 to 7 in which the area of the protruded portion was 20 area %, the stiction failure rate was measured to be relatively high, irrespective of the interval between the protrusions.

In the case of Test Nos. 8 to 14 in which the area of the protruded portion was greater than 40 area %, the stiction failure rate was measured to be relatively low. In the case of test No. 11, the stiction failure rate was measured to be relatively high among them, because the interval between the protrusions therein was relatively long.

Therefore, it may be confirmed that the larger the area of the protruded portion is, and the smaller the interval between the protrusions is, then, the more favorable the prevention of occurrence of the stiction failure.

Also, when test No. 3 in Table 1 is compared with test No. 10 in Table 2, it may be confirmed that the stiction failure rate varies with the difference in the thickness of the resonating portion. Therefore, when the thickness of the resonating portion is thinner than 1 μm, the effect of preventing occurrence of the stiction failure due to formation of the hydrophobic layer may be more remarkable.

Meanwhile, a shape of the specific protruded portion may be optimized in consideration of process conditions, design parameters, and the like, and there is no particular limitation thereto. Hereinafter, example forms thereof will be described for illustrative purposes, but the present disclosure is not limited thereto.

The area occupied by the protruded portion DP on the lower surface CL of the cavity may be about 40 area % or more, and the interval between the plural protrusions may be about 2 μm to about 20 μm.

This may be because when the area occupied by the protruded portion DP on the lower surface CL of the cavity is less than about 40 area % or the interval between the plural protrusions is more than about 20 μm, the effect of lowering the surface tension $F_L$ caused by the protrusions may be insufficient.

Meanwhile, since the upper surface CU of the cavity may not contact the lower surface CL of the cavity, but the number of protrusions may be excessively high such that the contact area between the upper surface CU of the cavity and the protrusion 117 increases, when the interval between the protrusions is less than about 2 μm. Therefore, the surface tension $F_L$ may increase, and the stiction failure rate may be likely to increase.

Meanwhile, an upper limit of the area occupied by the protruded portions DP is not particularly limited, and may be 100 area %.

A width (w) of the protrusion 117 may be 5 μm or less.

When the width (w) of the protrusion 117 is more than 5 μm, a contact area due to contact between the upper surface of the protrusion and the upper surface of the cavity may increase. When the lower surface of the protrusion 117 is circular, the width (w) of the protrusion 117 may refer to a diameter of the lower surface of the protrusion.

A height (h) of the protrusion 117 may be 10 to 90% of the thickness (t) of the cavity.

The elastic restoring force $F_R$ may not only be proportional to the cube of the thickness of the resonating portion 120, but also increase in proportion to the deformation depth. For example, when the upper surface of the cavity contacts the lower surface of the cavity, the elastic restoring force $F_R$ may increase in proportion to the thickness (t) of the cavity. When the upper surface of the cavity contacts the upper surface of the protrusion, the elastic restoring force $F_R$ may increase in proportion to the value obtained by subtracting the height (h) of the protrusion from the thickness (t) of the cavity.

When the height (h) of the protrusion 117 is less than 10% of the thickness (t) of the cavity, the upper surface of the cavity may directly contact the lower surface of the cavity. In this case, although the elastic restoring force $F_R$ may increase, since the contact area may rapidly increase, the increase in the surface tension $F_L$ may be greater, and the stiction failure rate may increase.

Meanwhile, when the height (h) of the protrusion 117 exceeds 90% of the thickness (t) of the cavity, the value obtained by subtracting the height (h) of the protrusion from the cavity thickness (t) becomes smaller. Therefore, the stiction failure rate may increase.

The protrusion 117 may have a conical shape, a polygonal pyramid shape, a cylindrical shape, a polygonal column shape, a truncated conical shape, or a truncated polygonal pyramid shape.

Figure 6A:
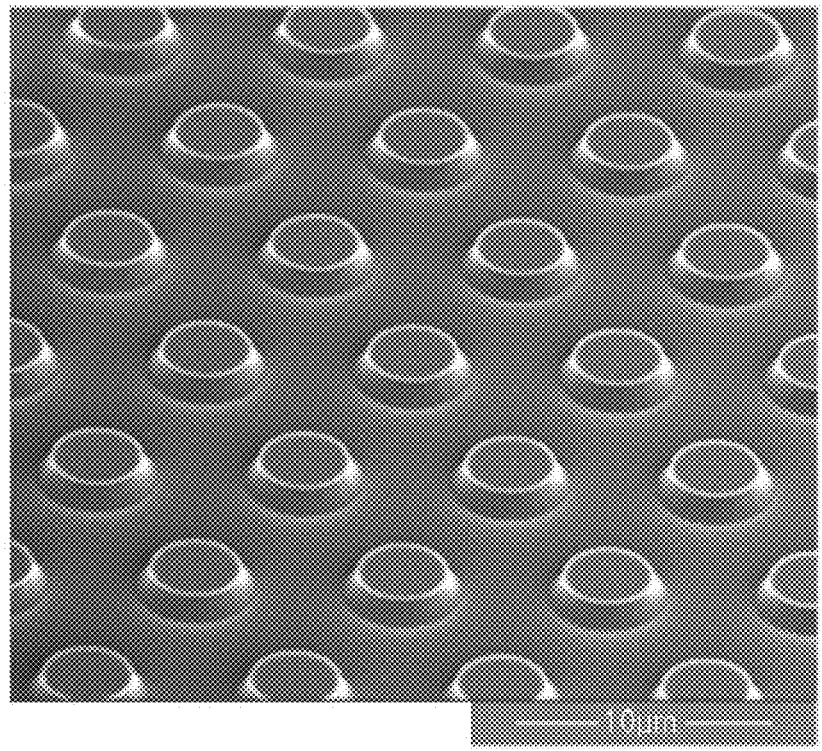
FIG. 6A is a photograph of a protrusion formed using a wet etching process.

FIG. 6A is a photograph of a protrusion formed using a wet etching process. As illustrated in FIG. 6A, a protrusion may have a cylindrical shape, and may be formed using a wet etching process.

Figure 6B:
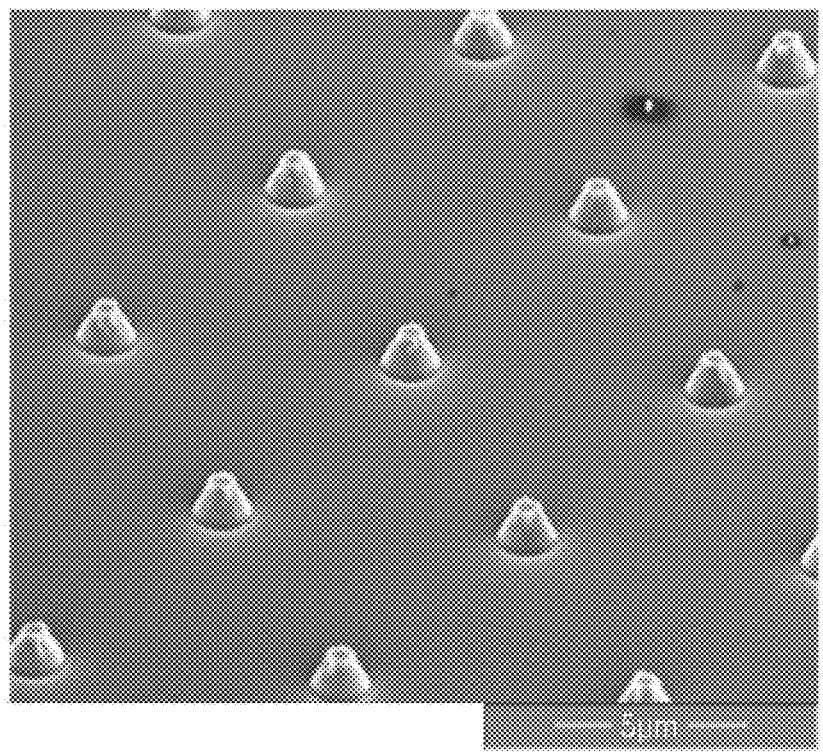
FIG. 6B is a photograph of a protrusion formed by using a dry etching process.

FIG. 6B is a photograph of a protrusion formed by using a dry etching process. As illustrated in FIG. 6B, a protrusion may have a truncated conical shape, in which a conical shape is cut in a plane parallel to the lower surface, and may be formed using a dry etching process.

Hereinafter, a hydrophobic layer 130 of the present disclosure will be described in more detail.

Referring to FIG. 2, in an acoustic resonator according to the examples described herein, the hydrophobic layer 130 may be disposed on the upper surface CU of the cavity C and the surface of the protruded portion DP.

When the hydrophobic layer 130 is not formed on one of the upper surface CU of the cavity C and the surface of the protruded portion DP, a contact angle may not be reduced as much as desired, and adhesion problems may occur in the cavity C.

The hydrophobic layer 130 may also be formed on a portion other than the protruded portion DP among the side surface of the cavity C and the lower surface CL of the cavity. As a result, the stiction failure rate may be further reduced.

As will be described later, the hydrophobic layer 130 may be formed, after removing polysilicon (Poly Si) constituting the sacrificial layer.

Figure 10A:
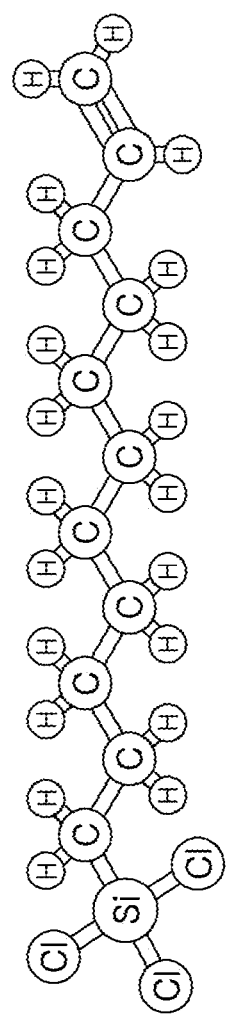
FIGS. 10A and 10B schematically illustrate a molecular structure of a precursor used as an adhesion layer of a hydrophobic layer.
Figure 10B:
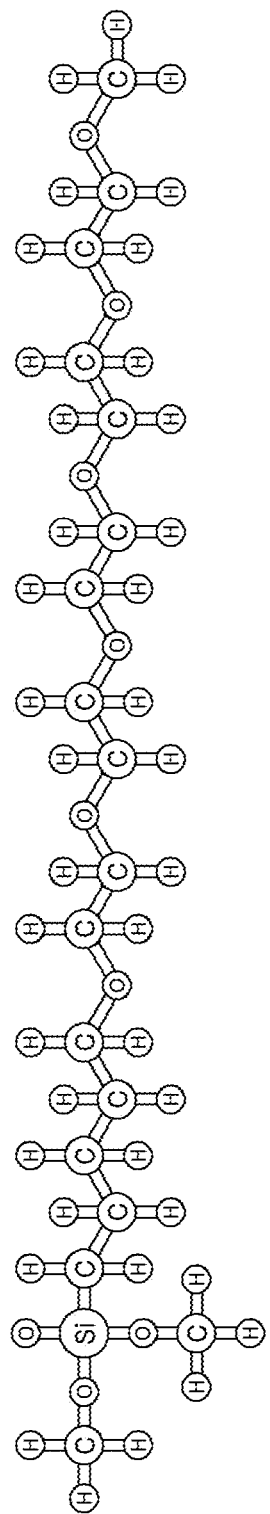

A precursor may be used to improve adhesion between the hydrophobic layer 130 and an inner surface of the cavity C. Referring to FIG. 10A, the precursor may be a hydrocarbon having a silicon head, or referring to FIG. 10B, the precursor may be a siloxane having a silicon head.

Figure 11:
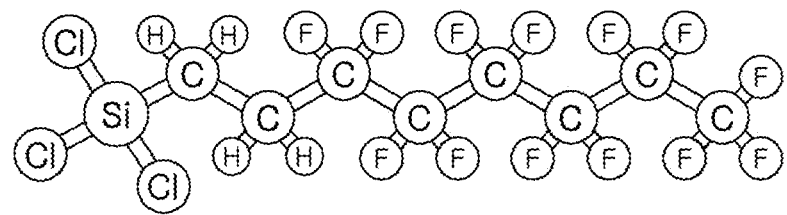
FIG. 11 schematically illustrates a molecular structure of a hydrophobic layer.

Referring to FIG. 11, the hydrophobic layer 130 may be a fluorocarbon, but is not limited thereto. The hydrophobic layer 130 may be formed of a material having a contact angle of 90° or more with water after deposition. For example, the hydrophobic layer 130 may contain a fluorine (F) component, and may include fluorine (F) and silicon (Si).

At this time, the hydrophobic layer 130 may be formed of a monolayer or a self-assembled monolayer (SAM) instead of a polymer, and a thickness thereof may be 100 Å or less. When the hydrophobic layer 130 may be formed of a polymer on the inner upper surface CU of the cavity C, mass of the polymer on the resonating portion 120 may be affected by the polymer. Since the hydrophobic layer 130 may be formed of a monolayer, an acoustic resonator in the examples described herein may minimize change in frequency of the acoustic resonator by the hydrophobic layer 130, even when the hydrophobic layer 130 is formed after a trimming process.

In addition, when the hydrophobic layer 130 is formed of a polymer, a thickness of the hydrophobic layer in the cavity C may become uneven when the hydrophobic layer may be formed in the cavity C through an injection hole (H in FIG. 1). A thickness of the hydrophobic layer in the vicinity of the inflow hole H in the hydrophobic layer in the cavity C may be relatively thick, and a thickness of the hydrophobic layer formed in the central region of the cavity C in the inflow hole H may be relatively thin. Since the hydrophobic layer 130 of an acoustic resonator in the examples described herein may be formed of a monolayer or a self-assembled monolayer (SAM), thicknesses of the cavity C in accordance with positions thereof may be relatively uniform.

Although the case in which the cavity is disposed on the substrate in parallel with the substrate has been described in the examples, the cavity may be formed by making a swimming pool in the substrate, or by having a mesa structure in the substrate, into which a peripheral portion is recessed. In addition, a solidly mounted resonator (SMR) structure may be included on the cavity, and the upper surface CU of the cavity may have a doom shape.

Manufacturing Method of Acoustic Resonator

Next, a manufacturing method of an acoustic resonator according to one or more examples will be described.

Figure 7:
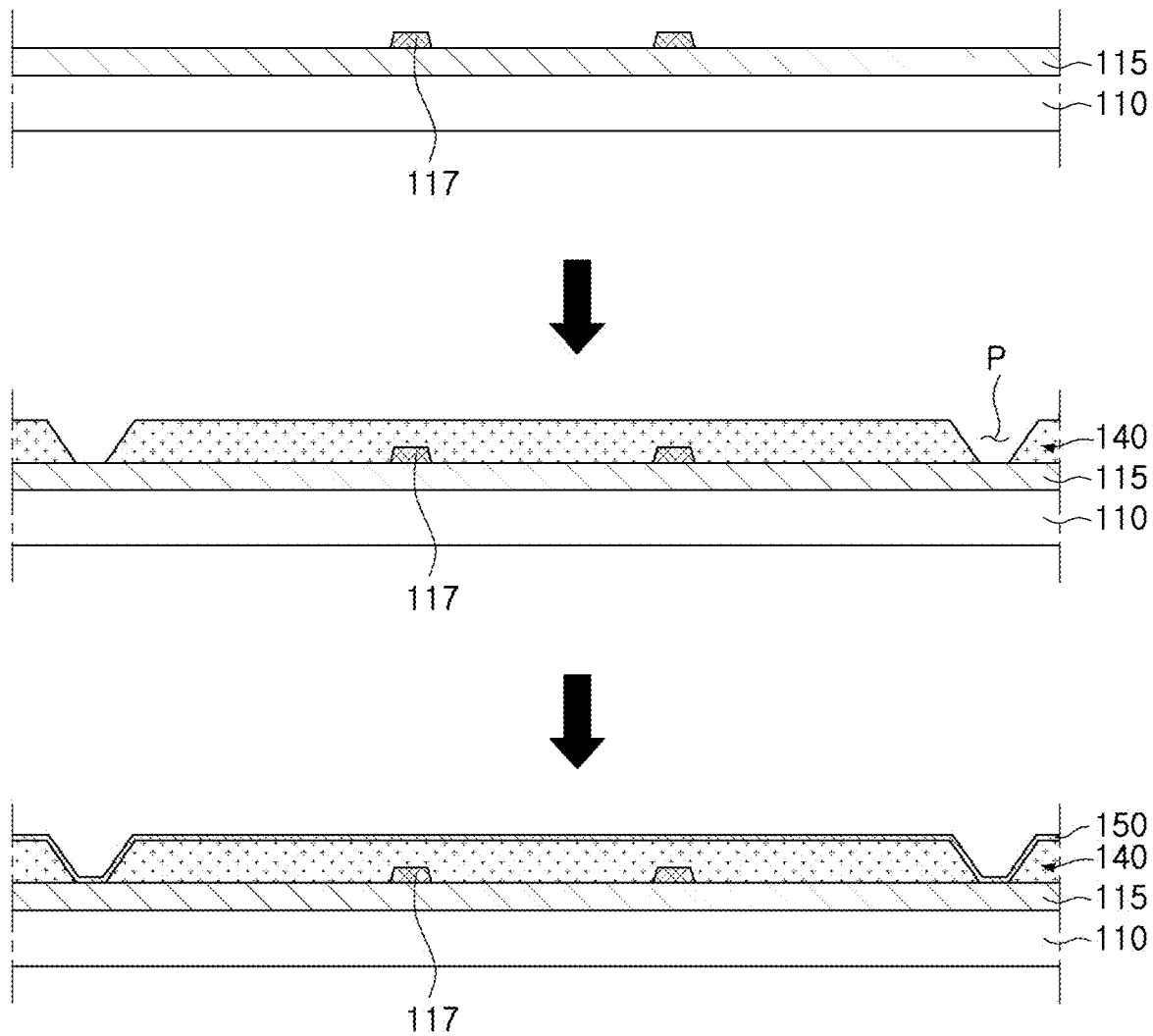
FIGS. 7, 8, and 9 are views depicting a method of manufacturing an acoustic resonator according to one or more examples described herein.
Figure 8:
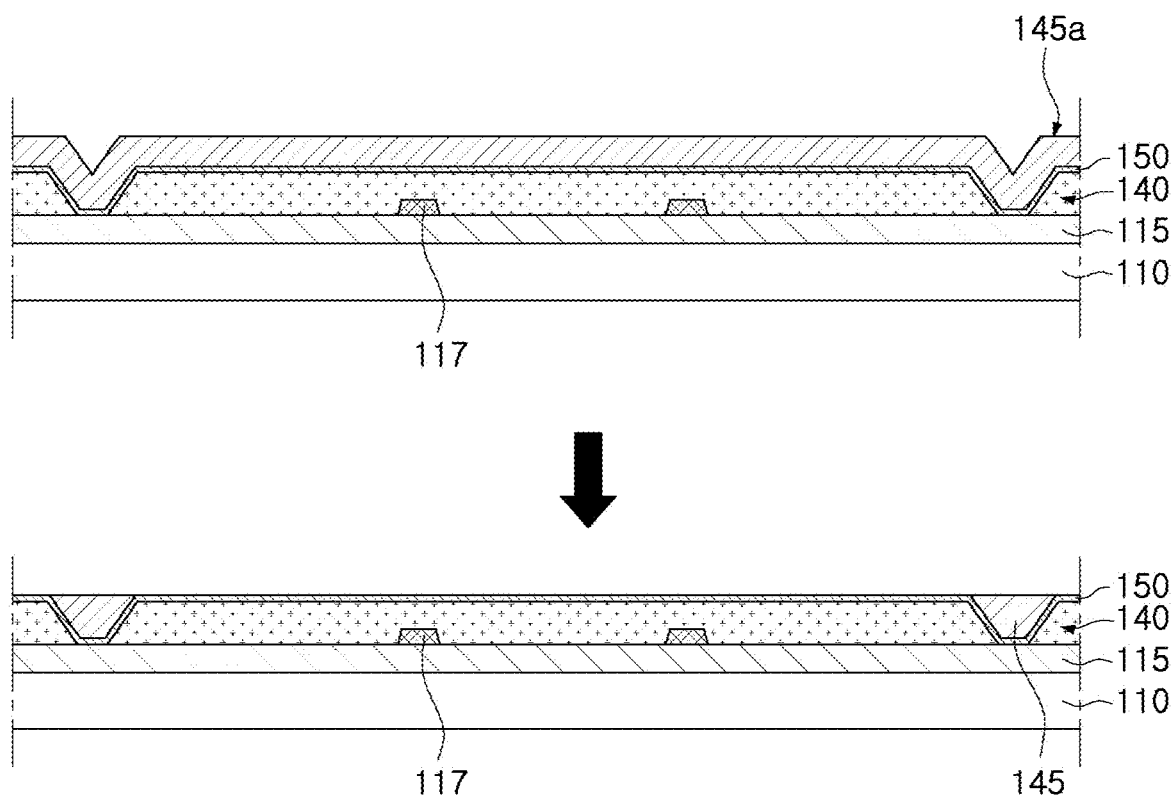
Figure 9:
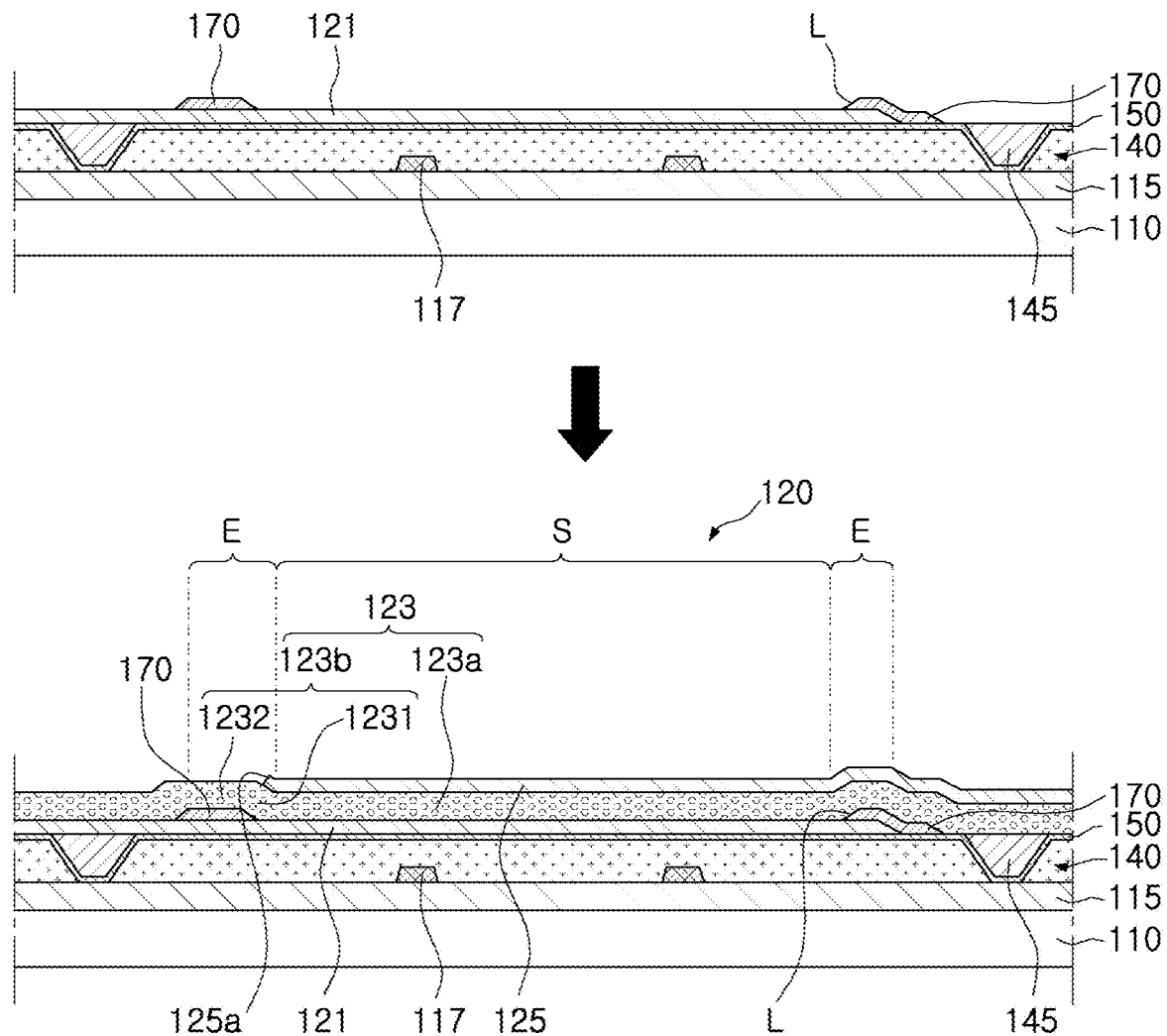

FIGS. 7 to 9 are views depicting a method of manufacturing an acoustic resonator according to one or more examples described herein.

Referring to FIG. 7, a method of manufacturing an acoustic resonator according to one or more examples described herein may include an operation of forming an insulation layer 115 and a protrusion 117 on a substrate 110. The protrusion 117 may be formed by a wet etching process or a dry etching process. The protrusion 117 may be made of a material, which may be removed by an etching liquid containing hydrogen fluoride (HF) and an etching gas containing a halogen gas, for example a material including an oxide such as silicon dioxide ($SiO_2$) or the like.

A sacrificial layer 140 may be formed on the insulation layer 115 and the protrusion 117, and then a pattern P penetrating the sacrificial layer 140 may be formed. Therefore, the insulation layer 115 may be exposed externally through the pattern P.

The insulation layer 115 and a membrane layer 150 may be formed of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), zinc oxide (ZnO), silicon nitride (SiN), or silicon oxide ($SiO_2$), but are not limited thereto.

The pattern P formed in the sacrificial layer 140 may be formed to have a trapezoidal cross-section in which a width on an upper surface thereof is broader than a width on a lower surface thereof.

The sacrificial layer 140 may be partially removed through a subsequent etching process to form a cavity (C in FIG. 2). Therefore, the sacrificial layer 140 may be formed of a material such as polysilicon or polymer that may be easy to etch. However, the present examples are not limited thereto.

A membrane layer 150 may be formed on the sacrificial layer 140. The membrane layer 150 may be formed with a certain thickness along a surface of the sacrificial layer 140. A thickness of the membrane layer 150 may be thinner than a thickness of the sacrificial layer 140.

The membrane layer 150 may include at least one of silicon dioxide ($SiO_2$) and silicon nitride ($Si_3N_4$). Further, the membrane layer 150 may include a dielectric layer containing at least one material among manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer containing at least one material among aluminum (Al), nickel (Ni), chromium (Cr), platinum (Pt), gallium (Ga), and hafnium (Hf). However, the examples described herein are not limited thereto.

Meanwhile, although not illustrated, a seed layer may be formed on the membrane layer 150.

The seed layer may be disposed between the membrane layer 150 and a first electrode 121, which will be described below. The seed layer may be made of aluminum nitride (AlN), but is not limited thereto, and may be formed using a dielectric or metal having an HCP structure. For example, when the seed layer is formed of a metal, the seed layer may be formed of titanium (Ti).

Next, an etching stop layer 145a may be formed on the membrane layer 150, as illustrated in FIG. 8. The etching stop layer 145a may be also filled in the pattern P.

The etching stop layer 145a may be formed to a thickness that completely fills the pattern P. Therefore, the etching stop layer 145a may be formed in a thickness thicker than a thickness of the sacrificial layer 140.

The etching stop layer 145a may be formed of the same material as the insulation layer 115, but is not limited thereto.

Then, the etching stop layer 145a may be removed such that the membrane layer 150 is exposed externally.

At this time, the portion filled in the pattern P may be left, and remaining portion of the etching stop layer 145a may function as an etching stop portion 145.

Next, as illustrated in FIG. 9, a first electrode 121 may be formed on an upper surface of the membrane layer 150.

The first electrode 121 may be formed of a conductive material, for example, may be formed of gold, molybdenum, ruthenium, iridium, aluminum, platinum, titanium, tungsten, palladium, tantalum, chromium, nickel, or a metal comprising at least one thereof, and may include at least one of rare earth metals and transition metals, but is not limited thereto.

The first electrode 121 may be formed on an upper portion of a region in which a cavity (C in FIG. 2) is to be formed.

The first electrode 121 may be formed by forming a conductive layer in a form entirely covering the membrane layer 150, and then by removing an unnecessary portion therefrom.

Then, an insertion layer 170 may be formed as needed. The insertion layer 170 may be formed on the first electrode 121, and may be extended to an upper portion of the membrane layer 150 as needed. An extension region E of the resonating portion 120 may be formed to be thicker than a central region S such that vibration generated at the central region S may be prevented from escaping externally, to increase a Q-factor.

The insertion layer 170 may be formed to cover the membrane layer 150 and the first electrode 121, and the entire surface formed by an etching stop portion 145, and then may be completed by removing a portion disposed on a region corresponding to the central region S.

A central region of the first electrode 121 constituting the central region S may be exposed externally of the insertion layer 170. The insertion layer 170 may be formed to cover a portion of the first electrode 121 along the periphery of the first electrode 121. Therefore, a rim portion of the first electrode 121 disposed in the extension region E may be disposed below the insertion layer 170.

The side surface of the insertion layer 170 disposed adjacent to the central region S may be formed as an inclined surface L. The insertion layer 170 may be formed in a shape such that its thickness becomes thinner toward the central region S, and a lower surface of the insertion layer 170 may be formed in a more extended shape toward the central region S than an upper surface of the insertion layer 170. At this time, an inclination angle of the inclined surface L of the insertion layer 170 may be formed in the range of 5° to 70° as described above.

The insertion layer 170 may be formed of a dielectric material such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from that of the piezoelectric layer 123.

Next, a piezoelectric layer 123 may be formed on the first electrode 121 and the insertion layer 170.

In one or more of the examples described herein, the piezoelectric layer 123 may be formed of aluminum nitride (AlN). However, the examples described herein are not limited thereto. As the material of the piezoelectric layer 123, zinc oxide (ZnO), doped aluminum nitride, lead zirconate titanate, quartz, or the like, may be selectively used. In the case of the doped aluminum nitride, a rare earth metal, a transition metal, or an alkaline earth metal may further be included. For example, the rare earth metal may include at least one of scandium (Sc), erbium (Er), yttrium (Y), and lanthanum (La), and amounts of the rare earth metal may be about 1 at % to about 20 at %. The transition metal may include at least one of hafnium (Hf), titanium (Ti), zirconium (Zr), tantalum (Ta), and niobium (Nb). The alkaline earth metal may include magnesium (Mg).

The piezoelectric layer 123 may be formed of a material different from that of the insertion layer 170.

The piezoelectric layer 123 may be formed by forming a piezoelectric material on the entire surface formed by the first electrode 121 and the insertion layer 170, and then by partially removing unnecessary portions therefrom. In one or more examples described herein, after a second electrode 125 is formed, the unnecessary portions of the piezoelectric material may be removed to complete the piezoelectric layer 123. However, the examples described herein are not limited thereto. Alternatively, the piezoelectric layer 123 may be completely formed before forming the second electrode 125.

The piezoelectric layer 123 may be formed to cover a portion of the first electrode 121 and the insertion layer 170. The piezoelectric layer 123 may be formed along a surface shape of which the first electrode 121 and the insertion layer 170 are formed.

The first electrode 121 may be exposed externally of the insertion layer 170 only at a portion corresponding to the central region S, as described above. Therefore, the piezoelectric layer 123 formed on the first electrode 121 may be located in the central region S. A bent portion 123b formed on the insertion layer 170 may be located in the extension region E.

Next, a second electrode 125 may be formed on the piezoelectric layer 123. In the examples described herein, the second electrode 125 may be formed of a conductive material, for example, may be formed of gold, molybdenum, ruthenium, iridium, aluminum, platinum, titanium, tungsten, palladium, tantalum, chromium, nickel, or a metal comprising at least one thereof, and may include at least one of rare earth metals and transition metals, but are not limited thereto.

The second electrode 125 may be basically formed on a piezoelectric portion 123a of the piezoelectric layer 123. As described above, the piezoelectric portion 123a of the piezoelectric layer 123 may be located in the central region S. Therefore, the second electrode 125 disposed on the piezoelectric layer 123 may be also disposed in the central region S.

In the examples described herein, the second electrode 125 may be also formed on an inclined portion 123l of the piezoelectric layer 123. As described above, the second electrode 125 may be entirely disposed in the central region S and may be partially disposed in the extension region E. Resonance performance may be remarkably improved by partially disposing the second electrode 125 in the extension region E.

Then, a protection layer 127 may be formed.

The protection layer 127 may be formed along a surface formed by the second electrode 125 and the piezoelectric layer 123. Although not illustrated, the protection layer 127 may also be formed on the insertion layer 170 externally exposed.

The protection layer 127 may be formed of any one of silicon oxide-based materials, silicon nitride-based materials, aluminum oxide-based materials, and aluminum nitride-based materials, but is not limited thereto.

Subsequently, the protection layer 127 and the piezoelectric layer 123 may be partially removed to partially expose the first electrode 121 and the second electrode 125, and a first metal layer 180 and a second metal layer 190 may be formed on the exposed portions, respectively.

The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum-germanium (Al—Ge) alloy, or the like, and may be deposited on the first electrode 121 or the second electrode 125, but are not limited thereto.

Then, a cavity C may be formed.

The cavity C may be formed by removing a portion of the sacrificial layer 140 located inside the etching stop portion 145. The portion of the sacrificial layer 140 to be removed in this process may be removed by an etching process.

When the sacrificial layer 140 may be formed of a material such as polysilicon or polymer, the sacrificial layer 140 may be removed by a dry etching process using a halide-based etching gas such as fluorine (F), chlorine (Cl), or the like (for example, $XeF_2$).

Then, a process of further etching the protection layer in a thickness direction may be performed to obtain the desired frequency characteristic.

Subsequently, a hydrophobic layer 130 may be formed on an upper surface CU of the cavity C and a surface of a protruded portion DP to complete the acoustic resonator 100 illustrated in FIG. 2.

The hydrophobic layer 130 may be formed by a chemical vapor deposition (CVD) process through an injection hole (H in FIG. 1).

Figure 12:
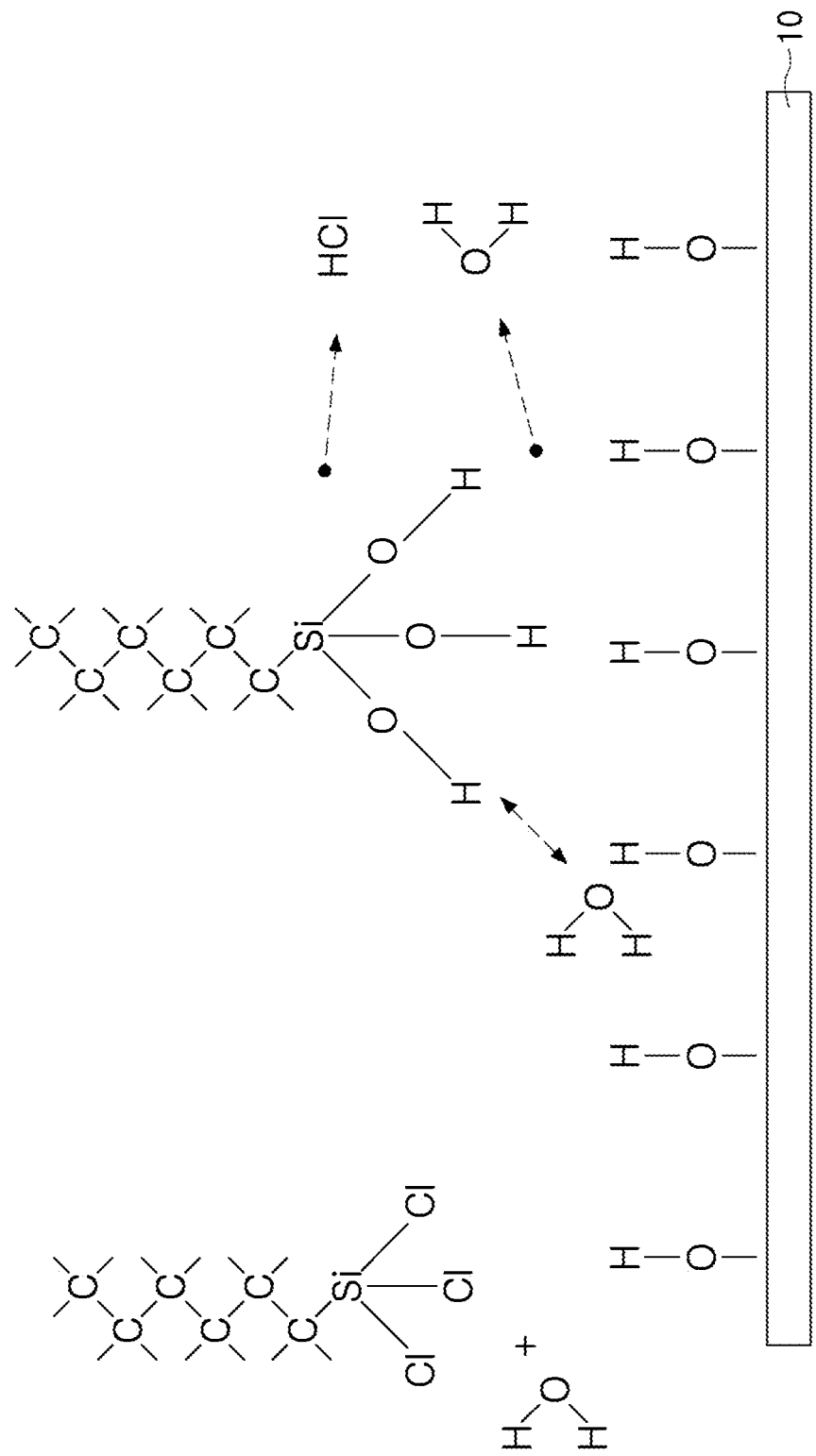
FIGS. 12 and 13 schematically illustrate a process of forming a hydrophobic layer.

Hydroxylate may be formed on a surface of the protruded portion DP and a surface of the membrane layer 150 when the cavity C is formed, as illustrated in a support member 10 made of $SiO_2$ in FIG. 12. An inner surface of the cavity (C) may be surface-treated by performing a silane hydrolysis reaction for the hydroxylate using such a precursor having a silicon head.

Figure 13:
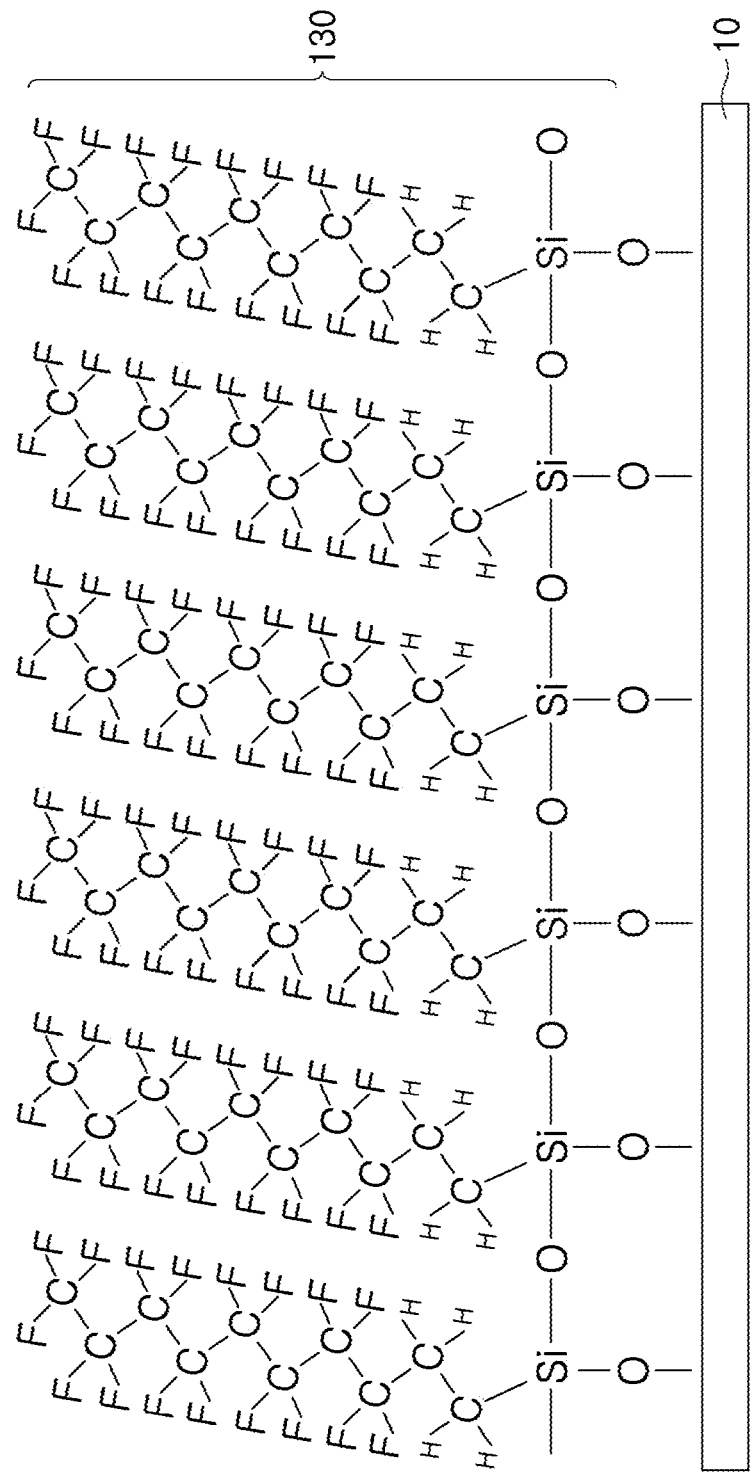

Referring to FIG. 13, a hydrophobic layer 130 may be formed on an upper surface CU of the cavity and a surface of a protruded portion DP by using a fluorocarbon functional group, which is hydrophobic.

The surface-treatment may be omitted depending on a material of the protruded portion DP and the membrane layer 150, and the hydrophobic layer 130 may be formed on the upper surface CU of the cavity and the surface of the protruded portion DP.

In a method of manufacturing an acoustic resonator according to one or more other examples as described herein, the hydrophobic layer 130 may be formed on a portion other than the protruded portion DP among the side surface of the cavity C and the lower surface CL of the cavity, as well as the upper surface CU of the cavity C and the surface of the protruded portion DP, since the hydrophobic layer 130 is formed with the CVD process after forming the cavity C.

In addition, the hydrophobic layer 130 may be formed of a monolayer or a self-assembled monolayer (SAM) rather than a polymer. Therefore, the thickness of the hydrophobic layer 130 may be 100 Å or less, mass load due to the hydrophobic layer 130 may be prevented from being applied to the resonating portion 120, and the thickness of the hydrophobic layer 130 may be uniform.

After the hydrophobic layer 130 is formed, a trimming process using a wet process may be performed to obtain a desired frequency characteristic.

Since the hydrophobic layer 130 is already formed on the upper surface of the cavity C and the surface of the protruded portion DP, a method of manufacturing an acoustic resonator according to the examples described herein may prevent the upper surface CU and the lower surface CL of the cavity C from adhering to each other, even after performing a wet process such as the trimming process or the like.

The examples described herein may arrange the hydrophobic layer inside the cavity to prevent the upper and lower surfaces of the cavity from adhering to each other during a wet process.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
a substrate;
an insulation layer disposed on the substrate;
a resonating portion disposed on the insulation layer and comprising a first electrode, a piezoelectric layer, and a second electrode, stacked thereon;
a cavity disposed between the insulation layer and the resonating portion;
a protruded portion comprising a plurality of protrusions disposed on a lower surface of the cavity; and
a hydrophobic layer disposed on an upper surface of the cavity and a surface of the protruded portion.

2. The acoustic resonator according to claim 1, wherein the protruded portion is disposed in a central region of the lower surface of the cavity.

3. The acoustic resonator according to claim 2, wherein the protruded portion comprises a shape corresponding to the lower surface of the cavity.

4. The acoustic resonator according to claim 1, wherein an area occupied by the protruded portion on the lower surface of the cavity is about 40% or more by area, and
an interval between the plurality of protrusions is about 2 μm to about 20 μm.

5. The acoustic resonator according to claim 1, wherein a width of the protrusion is 5 μm or less.

6. The acoustic resonator according to claim 1, wherein a height of the protrusion is 10 to 90% of a thickness of the cavity.

7. The acoustic resonator according to claim 1, wherein the protrusion has one or more of a cylindrical shape, a polygonal column shape, a truncated conical shape, or a truncated polygonal pyramid shape.

8. The acoustic resonator according to claim 1, wherein the protrusion comprises a wet etch formed cylindrical shape.

9. The acoustic resonator according to claim 1, wherein the protrusion comprises a dry etch formed truncated conical shape.

10. The acoustic resonator according to claim 1, wherein the resonating portion comprises a thickness of less than 1 μm.

11. The acoustic resonator according to claim 1, wherein the hydrophobic layer is disposed on a portion of the lower surface of the cavity, positioned lower than an upper surface of the protruded portion, and on a side surface of the cavity.

12. The acoustic resonator according to claim 1, wherein the hydrophobic layer is a monolayer or a self-assembled monolayer (SAM).

13. The acoustic resonator according to claim 1, wherein the hydrophobic layer comprises a fluorine (F) component.

14. The acoustic resonator according to claim 13, wherein the hydrophobic layer further comprises a silicon (Si) component.

15. The acoustic resonator according to claim 1,
wherein the resonating portion comprises:
a central region; and
an extension region in which an insertion layer is disposed below the piezoelectric layer, the extension region extending from the central region in an outward direction, and
wherein the piezoelectric layer comprises:
a piezoelectric portion disposed in the central region; and
a bent portion disposed in the extension region and extending obliquely in the piezoelectric portion along a shape of the insertion layer.

16. An acoustic resonator comprising:
a substrate;
an insulation layer disposed on the substrate;
a resonating portion disposed on the insulation layer and comprising a first electrode, a piezoelectric layer, and a second electrode, stacked thereon;
a cavity disposed between the insulation layer and the resonating portion; and
a protruded portion comprising a plurality of protrusions disposed on a lower surface of the cavity,
wherein an area occupied by the protruded portion on the lower surface of the cavity is about 40% or more by area, and
wherein an interval between the plurality of protrusions is about 2 μm to about 20 μm.

17. The acoustic resonator according to claim 16, wherein the protruded portion is disposed in a central region of the lower surface of the cavity.

18. A resonator comprising:
a cavity disposed on a substrate;
a resonating portion disposed on the cavity; and
a protruded portion comprising a plurality of protrusions disposed on a lower surface of the cavity and spaced apart from the resonating portion.

19. The resonator according to claim 18, further comprising a hydrophobic layer disposed on an upper surface of the cavity and a surface of the protruded portion.

20. The resonator according to claim 18,
wherein an area occupied by the protruded portion on the lower surface of the cavity is about 40% or more by area, and
wherein an interval between the plurality of protrusions is about 2 μm to about 20 μm.

* * * * *